United States Patent
Kasuya et al.

(10) Patent No.: US 8,115,299 B2
(45) Date of Patent: Feb. 14, 2012

(54) SEMICONDUCTOR DEVICE, LEAD FRAME AND METHOD OF MANUFACTURING SEMICONDUCTOR DEVICE

(75) Inventors: Yasumasa Kasuya, Kyoto (JP); Motoharu Haga, Kyoto (JP); Shoji Yasunaga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 120 days.

(21) Appl. No.: 12/528,759

(22) PCT Filed: Feb. 27, 2008

(86) PCT No.: PCT/JP2008/053353
§ 371 (c)(1),
(2), (4) Date: Aug. 26, 2009

(87) PCT Pub. No.: WO2008/105437
PCT Pub. Date: Sep. 4, 2008

(65) Prior Publication Data
US 2010/0013069 A1  Jan. 21, 2010

(30) Foreign Application Priority Data
Feb. 27, 2007 (JP) ................................. 2007-047394

(51) Int. Cl.
*H01L 23/495* (2006.01)
(52) U.S. Cl. ........ 257/693; 257/692; 257/666; 257/782; 257/784; 257/E23.031
(58) Field of Classification Search .................. 257/666, 257/782, 784, 692, 693, E23.031
See application file for complete search history.

(56) References Cited

U.S. PATENT DOCUMENTS

| | | | | |
|---|---|---|---|---|
| 6,603,194 | B2* | 8/2003 | Utsumi et al. | 257/667 |
| 7,033,866 | B2* | 4/2006 | Chow et al. | 438/123 |
| 7,183,630 | B1* | 2/2007 | Fogelson et al. | 257/666 |
| 7,915,054 | B2* | 3/2011 | Saigoh et al. | 438/3 |
| 7,939,933 | B2* | 5/2011 | Itou et al. | 257/696 |
| 2008/0251898 | A1* | 10/2008 | Itou et al. | 257/666 |
| 2009/0032977 | A1* | 2/2009 | Yamaguchi | 257/787 |
| 2009/0294950 | A1* | 12/2009 | Itou et al. | 257/690 |
| 2010/0127363 | A1* | 5/2010 | Nondhasitthichai et al. | 257/673 |
| 2010/0276806 | A1* | 11/2010 | Masuda et al. | 257/762 |
| 2011/0018122 | A1* | 1/2011 | Shimanuki | 257/692 |
| 2011/0177657 | A1* | 7/2011 | Itou et al. | 438/123 |

FOREIGN PATENT DOCUMENTS

| | | | | |
|---|---|---|---|---|
| JP | 2000-294715 | A | 10/2000 | |
| JP | 2000-294719 | | * 10/2000 | ........................ 23/50 |
| JP | 2000-294719 | A | 10/2000 | |
| JP | 2001-257304 | A | 9/2001 | |

* cited by examiner

*Primary Examiner* — Victor A Mandala
(74) *Attorney, Agent, or Firm* — Rabin & Berdo, PC

(57) ABSTRACT

A semiconductor device and a lead frame capable of preventing development of defective mounting resulting from a burr and a method of manufacturing a semiconductor device with the lead frame are provided. The semiconductor device includes a semiconductor chip and a lead arranged on the periphery of the semiconductor chip to extend in a direction intersecting with the side surface of the semiconductor chip, so that at least an end portion on the side farther from the semiconductor chip is bonded to a mounting substrate. A groove opened on a surface bonded to the mounting substrate and an end face on the side farther from the semiconductor chip is formed in the lead over the full width in the width direction orthogonal to the thickness direction and along the end face. An embedded body made of solder is embedded in the groove.

13 Claims, 6 Drawing Sheets

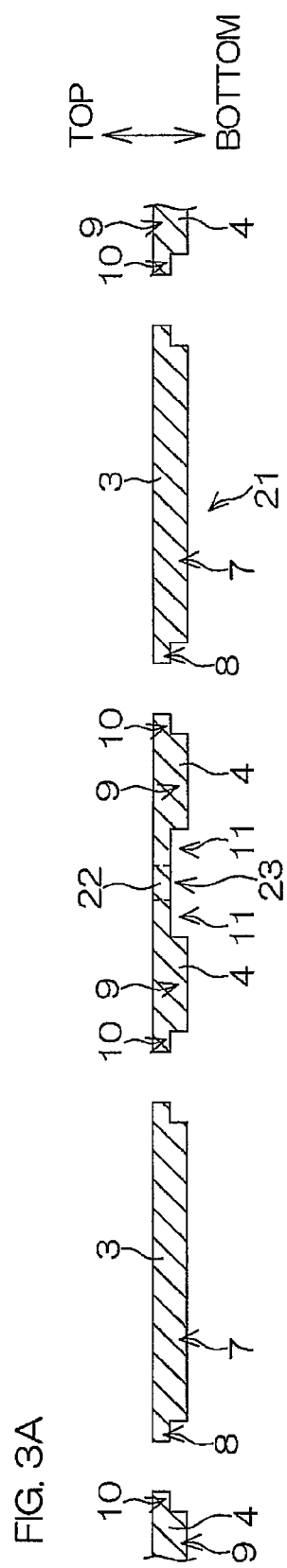

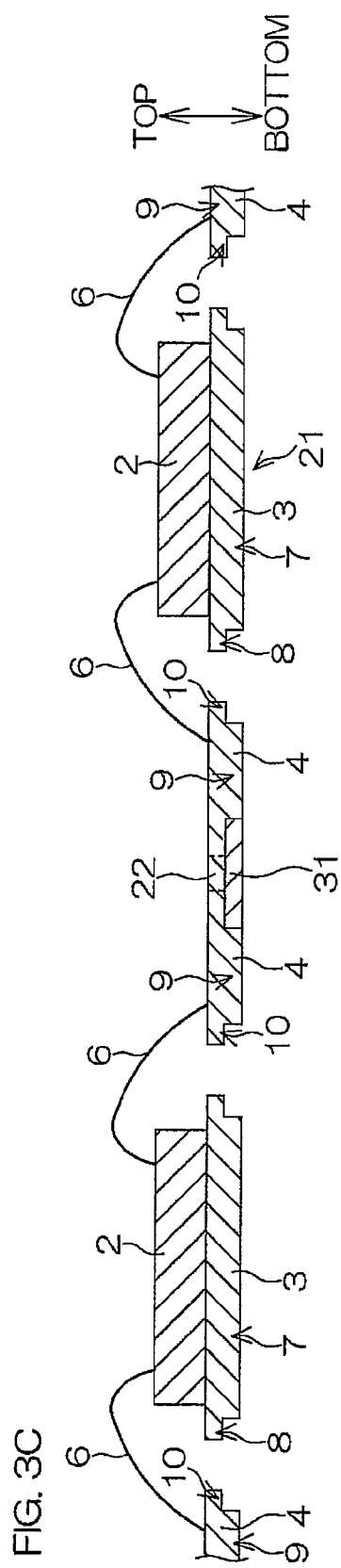

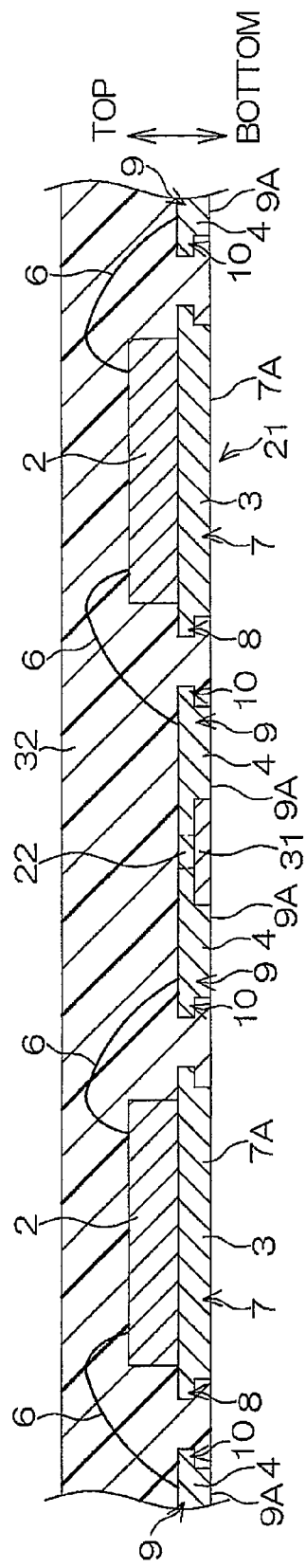

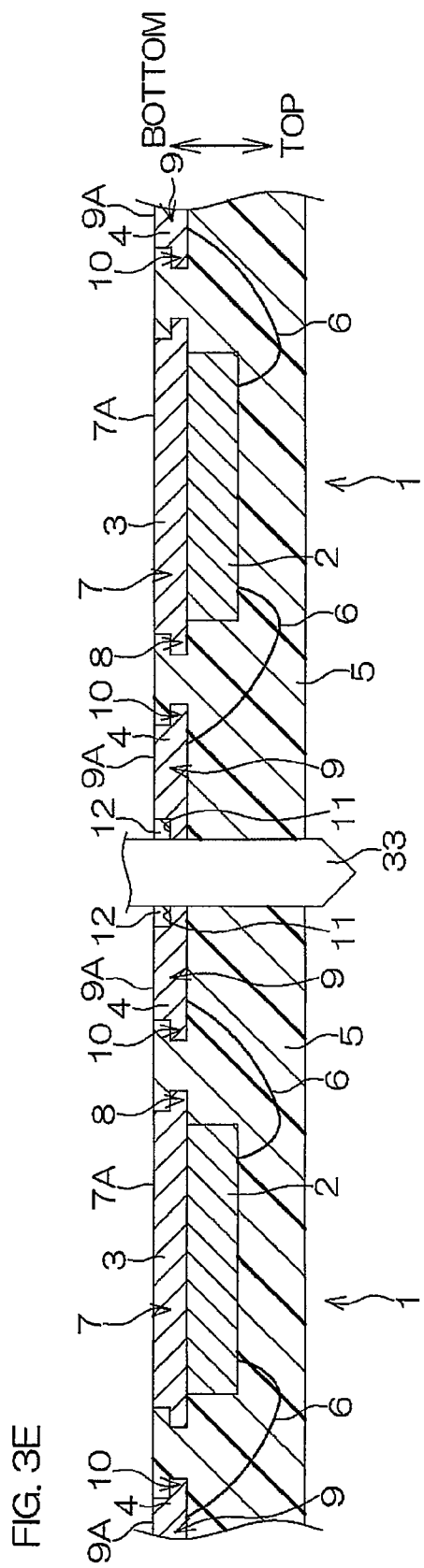

SEMICONDUCTOR DEVICE, LEAD FRAME AND METHOD OF MANUFACTURING SEMICONDUCTOR DEVICE

TECHNICAL FIELD

The present invention relates to a semiconductor device, a lead frame and a method of manufacturing a semiconductor device.

BACKGROUND TECHNIQUE

Following downsizing of electronic apparatuses, a demand for a semiconductor device to which a QFN (Quad Flat Non-leaded Package) is applied increases.

The semiconductor device to which the QFN is applied is prepared by a MAP (Molded Array Packaging) system, for example. According to the MAP system, a plurality of semiconductor chips are collectively sealed with sealing resin on a lead frame, and thereafter cut into individual semiconductor devices each including one semiconductor chip.

The lead frame is made of copper, for example. The lead frame includes a lattice-type supporting portion. A rectangular die pad and a plurality of leads are formed in each rectangular region surrounded by the supporting portion. The lead is arranged on the periphery of a die pad. Each lead is formed in a long shape having a base end portion connected to the supporting portion and a free end portion extending toward the die pad.

After the semiconductor chip is die-bonded onto each die pad, a terminal formed on each semiconductor chip and the upper surface of the lead on the periphery thereof are connected (wire-bonded) to each other through a bonding wire. When wire bonding of all semiconductor chips is completed, the lead frame is set in a molding set, and all semiconductor chips on the lead frame are collectively sealed with resin. Thereafter a dicing saw is introduced from the side of the lower surface of the lead frame along dicing lines set on the supporting portion, so that the supporting portion and the sealing resin on the supporting portion are removed. Thus, each lead is separated from the supporting portion, and each individual semiconductor device is obtained.

In the semiconductor device, the lower surface of each lead is exposed on the lower surface of the sealing resin, and mounting of the semiconductor device on a mounting substrate is accomplished by bonding the lower surface of each lead to a land on the mounting substrate (a wiring board). In the semiconductor device to which the QFN is applied, there is no extension of the lead from the side surface of the sealing resin, whereby the mounting area can be remarkably reduced as compared with a semiconductor device to which a QFP (Quad Flat Package) is applied.

Patent Document Japanese Unexamined Patent Publication No. 2001-257304

DISCLOSURE OF THE INVENTION

Problems to be Solved

When each lead is separated from the supporting portion with the dicing saw, however, copper which is the material for the lead may followingly elongate, to form a downwardly extending burr on an end portion of the lead. When such a burr is formed, the burr comes into contact with the land on the mounting substrate and the semiconductor device floats up from the mounting substrate on the portion of the burr, and hence the semiconductor device is mounted on the mounting substrate in an inclined state. Such a mounting state may cause a warp of the mounting substrate resulting from a temperature change in the periphery, leading to defective mounting such as defective connection between the lead and the land resulting from the warpage.

Accordingly, an object of the present invention is to provide a semiconductor device and a lead frame capable of preventing development of defective mounting resulting from a burr and a method of manufacturing a semiconductor device with the lead frame.

Solutions to the Problems

A semiconductor device according to an aspect of the present invention includes a semiconductor chip, and a lead arranged on the periphery of the semiconductor chip to extend in a direction intersecting with the side surface of the semiconductor chip so that at least an end portion on the side farther from the semiconductor chip is bonded to a mounting substrate. A groove opened on a surface bonded to the mounting substrate and an end face on the side farther from the semiconductor chip is formed in the lead over the full width in the width direction orthogonal to the thickness direction and along the end face, and an embedded body made of solder is embedded in the groove.

The groove opened on the surface bonded to the mounting substrate and the end face (the outer end face) on the side farther from the semiconductor chip is formed in the lead. The embedded body made of solder is embedded in the groove. When the lead is separated from a lead frame, therefore, a cutting blade (a dicing saw, for example) comes into contact with the outer end face of the lead and an end face of the embedded body. The groove is formed over the full width of the lead in the width direction, whereby no burr is formed by elongation of the material for the lead following the cutting blade, even if a burr is formed by elongation of solder, which is the material for the embedded body, following the cutting blade. Even if the burr made of solder is present, the burr is melted by reflow treatment in mounting of the semiconductor device on the mounting substrate, whereby there is no possibility that the semiconductor device is mounted on the mounting substrate in an inclined state. Therefore, the semiconductor device causes no development of defective mounting resulting from the burr. Further, the embedded body is made of solder, whereby solder employed as a bonding agent for the lead and the mounting substrate can wetly creep up the end face of the embedded body, and the so-called solder fillet can be formed on the end face of the lead. Therefore, the bonded (soldered) state between the lead and the wiring board can be easily visually tested.

A lead frame according to another aspect of the present invention includes a die pad loaded with a semiconductor chip on a surface of one side, a lead arranged on the periphery of the die pad to extend in a direction opposed to the die pad, and a supporting portion connected with an end portion of the lead on the side farther from the die pad. A groove is formed in the lead on a surface opposite to the side in the end portion on the side farther from the die pad over the full width in the width direction orthogonal to the longitudinal direction of the lead and orthogonal to the thickness direction.

With the lead frame, a semiconductor device capable of preventing development of defective mounting resulting from a burr can be manufactured by a manufacturing method including a bonding step of die-bonding a semiconductor chip onto the die pad and electrically connecting the semiconductor chip and the lead to each other with a bonding wire, a sealing step of sealing the semiconductor chip with sealing resin along with the lead frame so that the solder embedded in the groove is exposed from the sealing resin after the bonding step, and a dicing step of removing the supporting portion and the sealing resin on the supporting portion by cutting with a dicing saw.

In the surface of the lead frame opposite to the side on which the semiconductor chip is arranged, the groove is formed on the end portion of the lead on the side farther from the die pad. The groove is filed up with solder. In the dicing step of removing the supporting portion and the sealing rein on the supporting portion, therefore, the side surface of the dicing saw comes into contact with the lead, the solder embedded in the groove and the sealing resin. The groove is formed over the full width of the lead in the width direction, whereby no burr is formed by elongation of the material for the lead following a cutting blade, even if a burr is formed by elongation of the solder embedded in the groove following the side surface of the dicing saw. Even if a burr made of solder is present, the burr is melted by reflow treatment in mounting of the semiconductor device on the mounting substrate, whereby there is no possibility that the semiconductor device is mounted on the mounting substrate in an inclined state. According to the manufacturing method, therefore, a semiconductor device capable of preventing development of defective mounting resulting from a burr can be manufactured.

The foregoing and other objects, features and effects of the present invention will become more apparent from the following detailed description of the embodiments with reference to the attached drawings.

BRIEF DESCRIPTION OF THE DRAWINGS

FIG. 3A is a schematic sectional view showing a manufacturing step (a step of preparing the lead frame) for the semiconductor device.

FIG. 3C is a schematic sectional view showing a step (a bonding step) subsequent to FIG. 3B.

FIG. 3D is a schematic sectional view showing a step (a sealing step) subsequent to FIG. 3C.

FIG. 3E is a sectional view showing a step (a dicing step) subsequent to FIG. 3D.

Figure 1:
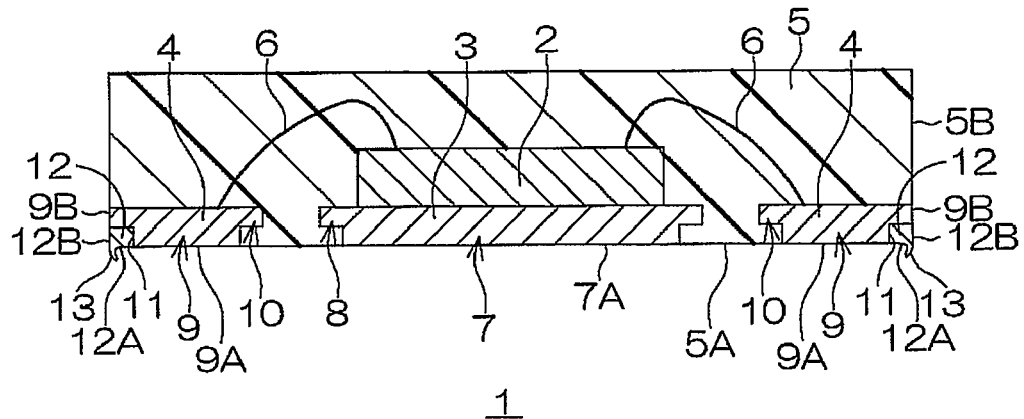
FIG. 1 is a schematic sectional view of a semiconductor device according to an embodiment of the present invention.

DESCRIPTION OF THE REFERENCE NUMERALS 1 semiconductor device
2 semiconductor chip
3 die pad
4 lead
5 sealing resin
6 bonding wire
9A lower surface (bonded surface)
9B end face
11 groove
12 embedded body
21 lead frame
22 supporting portion
23 groove
31 solder
32 resin
33 dicing saw

BEST MODE FOR CARRYING OUT THE INVENTION

An embodiment of the present invention is now described in detail with reference to the attached drawings.

FIG. 1 is a schematic sectional view of a semiconductor device according to the embodiment of the present invention.

A semiconductor device 1 is a semiconductor device to which the QFN is applied. The semiconductor device 1 includes a semiconductor chip 2, a die pad 3 supporting the semiconductor chip 2, a plurality of leads 4 electrically connected with the semiconductor chip 2, and sealing resin 5 sealing the same.

The semiconductor chip 2 is die-bonded onto the die pad 3 while upwardly directing a surface (a device forming surface) on a side provided with functional elements. A plurality of pads (not shown) are formed on the surface of the semiconductor chip 2 by partially exposing a wiring layer from a surface protective film. The respective pads are electrically connected with the leads 4 through bonding wires 6 formed by thin gold wires.

The die pad 3 and the leads 4 are formed by thin metal plates, as described later.

The die pad 3 integrally includes a body portion 7 rectangular in plan view and a stop portion 8 in the form of a rectangular frame surrounding the periphery of the body portion 7.

A lower surface 7A of the body portion 7 is exposed from a lower surface 5A of the sealing resin 5. A solder plating layer (not shown), for example, is formed on the lower surface 7A of the body portion 7 exposed from the lower surface 5A of the sealing resin 5.

The stop portion 8 is more thinly formed than the body portion 7. The upper surface of the stop portion 8 is flush with the upper surface of the body portion 7. When the lead 4 is resin-sealed along with the semiconductor chip 2, the sealing resin 5 enters a space under the stop portion 8, whereby displacement of the die pad 3 from the sealing resin 5 is prevented.

The leads 4 are provided on both sides of the die pad 3 in each direction orthogonal to each side surface thereof by the same numbers respectively. The leads 4 opposed to each side surface of the die pad 3 are arranged at regular intervals in a direction parallel to the opposed side surface.

Each lead 4 is in the form of a rectangle in plan view elongated in the direction (the direction opposed to the die pad 3) orthogonal to the side surface of the die pad 3. Each lead 4 integrally includes a body portion 9 and a stop portion 10 formed by crushing an end portion closer to the die pad 3 from the side of the lower surface.

A lower surface 9A of the body portion 9 is exposed from the lower surface 5A of the sealing resin 5, while an end face 9B in the longitudinal direction is exposed from a side surface 5B of the sealing resin 5. A solder plating layer (not shown) is formed on the lower surface 9A of the body portion 9 exposed from the lower surface 5A of the sealing resin 5, and the lower surface 9A functions as an external terminal solder-bonded to a land on amounting substrate (a wiring board). On the other hand, the upper surface of the body portion 9 is sealed in the sealing resin 5. The upper surface of the body portion 9 acts as an inner lead, to which the corresponding bonding wire 6 is connected.

In an end portion of the body portion 9 on the side opposite to the stop portion 10, a groove 11 opened on the lower surface 9A and the end face 9B is formed over the full width in the width direction (the direction along the end face 5B) orthogonal to the longitudinal direction of the lead 4 and orthogonal to the thickness direction.

An embedded body 12 made of solder is embedded in the groove 11. The embedded body 12 has a lower surface 12A flush with the lower surface 9A of the body portion 9 and an end face 12B flush with the end face 9B of the body portion 9.

Further, the embedded body 12 has a burr 13 formed by downward elongation of the solder which is the material for the embedded body 12 on an end portion of the lower surface 12A closer to the end face 12B.

The stop portion 10 is more thinly formed than the body portion 9. The upper surface of the stop portion 10 is flush with the upper surface of the body portion 9. When the lead 4 is resin-sealed along with the semiconductor chip 2, the sealing resin 5 enters a space under the stop portion 10, whereby displacement of the lead 4 from the sealing resin 5 is prevented.

Figure 2:
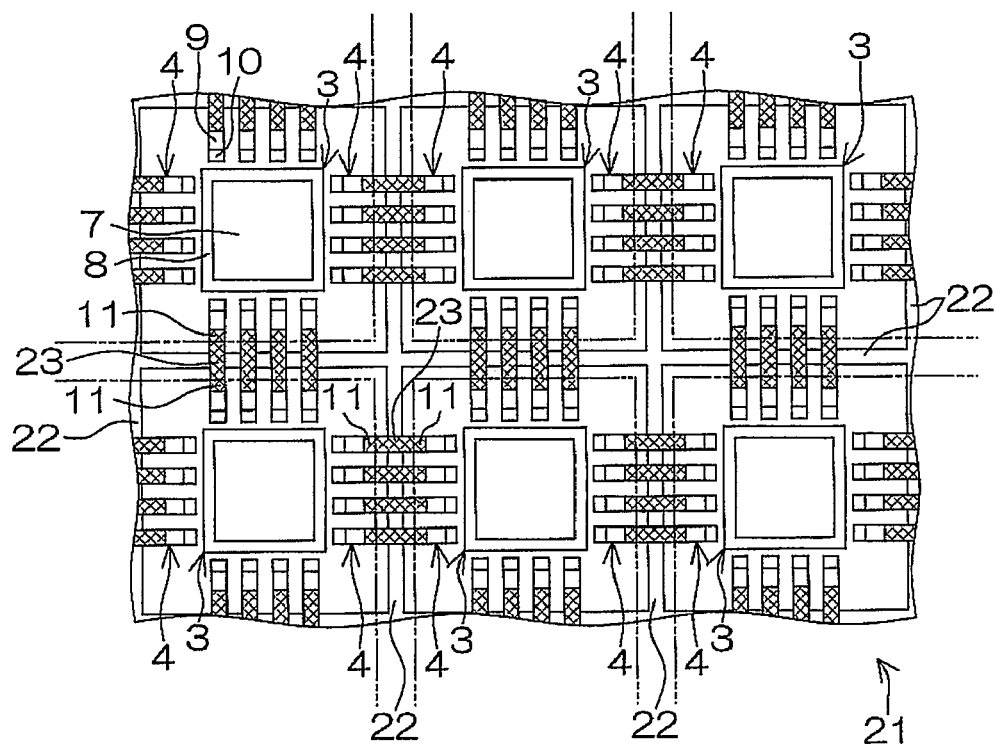
FIG. 2 is a bottom plan view partially showing a lead frame employed for manufacturing the semiconductor device.

FIG. 2 is a bottom plan view partially showing a lead frame employed for manufacturing the semiconductor device 1.

The semiconductor device 1 is manufactured by a MAP system employing a lead frame 21, as described later.

The lead frame 21 is formed by working a thin plate of a metal (copper or 42 alloy, for example). The lead frame 21 integrally includes a lattice-type supporting portion 22, die pads 3 arranged in respective rectangular regions surrounded by the supporting portion 22, and the plurality of leads 3 arranged on the peripheries of the die pads 3.

End portions of the respective leads 4 opposite to the sides closer to the die pads 3 are connected to the supporting portion 22. Between each pair of die pads 3 adjacent to each other, the respective leads 4 arranged on the periphery of one of the die pads 3 and the respective leads 4 arranged on the periphery of the other die pad 3 are opposed to one another in the longitudinal directions of the leads 4 through the supporting portion 22, and linearly extend. The grooves 11 of the respective leads 4 opposed to one another through the supporting portion 22 communicate with one another by grooves 23 formed in the supporting portion 22 with depths and widths identical to those of the grooves 11. In other words, the grooves 11 and the grooves 23 are formed as single grooves extending in the longitudinal directions of the leads 4 between the end portions of the respective leads 4 opposed to one another through the supporting portion 22. Referring to FIG. 2, the grooves 11 and the grooves 23 are crosshatched, for facilitating easy understanding.

FIGS. 3A to 3E are schematic sectional views successively showing manufacturing steps for the semiconductor device 1.

In the manufacturing steps for the semiconductor device 1, the lead frame 21 is prepared, as shown in FIG. 3A.

Referring to FIGS. 3A to 3E, only a cut surface of the lead frame 21 is shown.

Figure 3B:
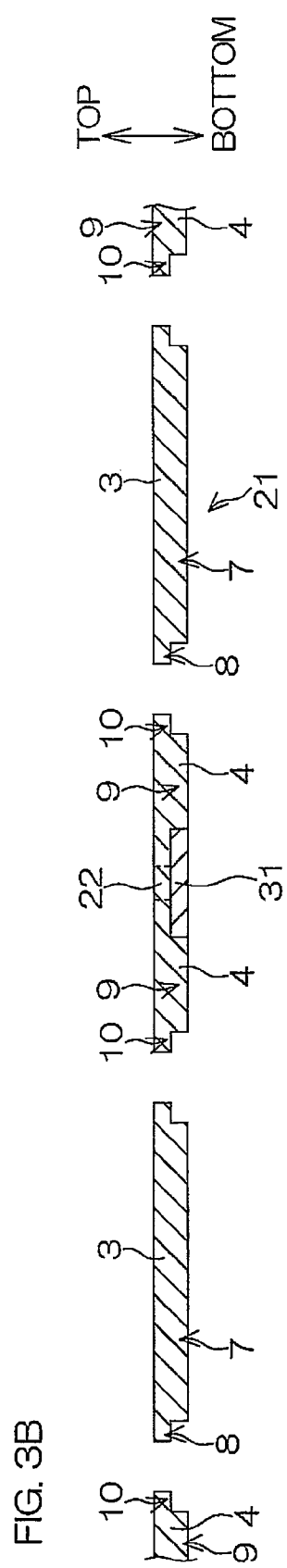
FIG. 3B is a schematic plan view showing a step (a step of embedding solder) subsequent to FIG. 3A.

First, solder 31 is embedded in the grooves 11 and each groove 23 of the lead frame 21, as shown in FIG. 3B. The solder 31 can be formed by plating, for example. The solder 31 can also be formed by paste printing and reflow treatment. Further, the solder 31 can also be formed by performing reflow treatment after arranging ball-shaped solder in the grooves 11 and the groove 23.

Then, semiconductor chips 2 are die-bonded onto the die pads 3 of the lead frame 21 through a bonding agent (not shown) made of high-melting point solder (solder having a melting point of not less than 260° C.), for example, as shown in FIG. 3C. Then, ends of the bonding wires 6 are connected to pads of the semiconductor chips 2, and other ends of the bonding wires 6 are connected (wire-bonded) to the upper surfaces of the leads 4.

When wire bonding of all semiconductor chips 2 is completed, the lead frame 21 is set in a molding die, and all semiconductor chips 2 on the lead frame 21 are collectively sealed with sealing resin 32 along with the lead frame 21, as shown in FIG. 3D. Then, a solder plating layer (not shown) is formed on the lower surface (the lower surfaces 7A of the body portions 7 of the die pads 3 and the lower surfaces 9A of the body portions 9 of the leads 4) of the lead frame 21 exposed from the sealing resin 32.

Thereafter a dicing saw 33 is introduced from the side of the lower surface of the supporting portion 22 along a dicing line set on the supporting portion 22 of the lead frame 21 as shown in FIG. 3E, and the supporting portion 22, the sealing resin 32 on the supporting portion 22, as well as parts of the leads 4 and the sealing resin 32 present on regions of prescribed widths on both sides of the supporting portion 22 are removed. In other words, the lead frame 21 and the sealing resin 32 present on zonal regions held between two-dot chain lines shown in FIG. 2 are removed. Thus, each lead 4 is separated from the supporting portion 22, the solder 31 embedded in each groove 11 forms the embedded body 12, the separated sealing resin 32 forms the sealing resin 5, and the individual semiconductor device 1 having the structure shown in FIG. 1 is obtained.

In the cutting (dicing) with the dicing saw 33, each side surface of the dicing saw 33 comes into contact with the lead 4, the solder 31 (the embedded body 21) and the sealing resin 32 (the sealing resin 5). Therefore, the solder 31 embedded in the groove 11 may elongate following the side surface of the dicing saw 33, to form the burr 13 on the end portion of the lower surface 12A of the embedded body 12 closer to the end face 12B, as shown in FIG. 1. However, the groove 11 is formed over the full width of the lead 4 in the width direction, whereby no burr is formed by elongation of the material for the lead 4 following a cutting blade. Even if the burr 13 made of solder is present, the burr 13 is melted by reflow treatment in mounting of the semiconductor device 1 on the mounting substrate, and hence there is no possibility that the semiconductor device 1 is mounted on the mounting substrate in an inclined state. Therefore, the semiconductor device 1 causes no development of defective mounting resulting from the burr 13.

Further, the embedded body 12 is made of solder, whereby the solder employed as the bonding agent for the lead 4 and the mounting substrate can wetly creep up the end face 12B of the embedded body 12, and the so-called solder fillet can be formed on the end face of the lead 4. Therefore, the bonded (soldered) state between the lead 4 and the wiring board can be easily visually tested.

According to the embodiment, the grooves 11 of the respective leads 4 opposed to one another through the supporting portion 22 in the lead frame 21 communicate with one another by the grooves 23 formed in the supporting portion 22 with the depths and the widths identical to those of the grooves 11. When the grooves 11 formed in the respective leads 4 reach the regions (the zonal regions held between the two-dot chain lines shown in FIG. 2) of the prescribed widths on both sides of the supporting portion 22 in the lead frame 21, however, the grooves 23 may not be formed in the supporting portion 22. In other words, the grooves 23 may not be formed in the supporting portion 22 if the grooves 11 are formed in such lengths that the side surfaces of the dicing saw 33 come into contact with the solder 31 embedded in the grooves 11.

While the embodiment of the present invention has been described, the present invention may be embodied in other ways. For example, while the semiconductor device to which the QFN is applied has been employed, the present invention is also applicable to a semiconductor device to which another type of non-leaded package such as an SON (Small Outlined Non-leaded Package) is applied.

The present invention is not restricted to the so-called singulation type semiconductor device so formed that end faces of leads and side surfaces of sealing resin are flush with one another, but is also applicable to a semiconductor device to which a lead-cut type non-leaded package having leads protruding from side surfaces of sealing resin is applied.

Further, the present invention is not restricted to the non-leaded package, but is also applicable to a semiconductor device to which a package having outer leads resulting from protrusion of leads from sealing resin is applied.

In addition, the present invention is not restricted to the MAP system, but the semiconductor device may be manufactured by an individual sealing method separately sealing individual semiconductor chips.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2007-47394 filed with the Japan Patent Office on Feb. 27, 2007, the disclosure of which is incorporated herein by reference.

The invention claimed is:

1. A semiconductor device, comprising:
    a semiconductor chip; and
    a lead arranged on the periphery of the semiconductor chip to extend in a direction intersecting with a side surface of the semiconductor chip, the lead having an end portion farther from the semiconductor chip, which is bonded to a mounting substrate, wherein
    a groove is formed in the lead such that the lead is dented from a lower surface thereof over a full width of the lead in a width direction of the lead at the end portion so that the groove is opened at the lower surface and a side surface of the lead, and
    an embedded body made of solder is embedded in the groove.

2. The semiconductor device according to claim 1, wherein a solder plating layer is formed on the lower surface of the lead.

3. The semiconductor device according to claim 2, wherein a burr downwardly extending is formed by a dicing process on an exposed side surface and an exposed bottom surface of the embedded body embedded in the groove.

4. The semiconductor device according to claim 3, further comprising:
    a die pad which supports the semiconductor chip;
    a plurality of leads which are electrically connected with the semiconductor chip, each of the plurality of leads being configured in a similar manner to said lead; and
    sealing resin which seals the semiconductor chip, the die pad and the plurality of leads,
    wherein each of the plurality of leads is formed by a thin metal plate and has an elongated shape in plan view, and one end portion of the elongated lead faces to the die pad.

5. The semiconductor device according to claim 4, wherein each of the leads has a thin stop portion with a stop space under the stop portion in a lower side of each lead at the one end portion.

6. The semiconductor device according to claim 5, wherein the stop portion of each lead is formed by crushing from the lower surface of each lead.

7. The semiconductor device according to claim 6, wherein the sealing resin covers an upper surface and side surfaces of the plurality of leads for sealing and enters the stop space of each lead in the lower side of each lead at the one end portion of each lead so that the lower surface of each lead and the embedded body embedded in the groove are exposed from the sealing resin.

8. The semiconductor device according to claim 5,
    wherein the die pad has a body portion formed by thin metal plate in the form of a rectangle in plan view and a stop portion in the form of a rectangular frame surrounding the periphery of the body portion, the stop portion of the die pad is more thinly formed than the body portion and an upper surface of the stop portion of the die pad is flush with an upper surface of the body portion,
    wherein a stop space is formed below the stop portion of the die pad and beside a side surface of the body portion, and
    wherein a solder plating layer is formed in a lower surface of the body portion.

9. The semiconductor device according to claim 8,
    wherein the sealing resin covers the die pad, the semiconductor chip die-bonded onto the die pad and the upper surface and the side surfaces of the plurality of leads for sealing and enters the stop space of the die pad under the stop portion of the die pad and the stop space under the stop portion of the lead, so that the lower surface of the body portion of the die pad, the lower surface of the lead and the embedded body embedded in the groove are exposed from the sealing resin.

10. A lead frame, comprising:
    a die pad loaded with a semiconductor chip on an upper surface thereof;
    a plurality of leads arranged on a side region of the die pad to extend in a direction opposed to the die pad, each of the plurality of leads having a first side facing the die pad and a second side farther from the die pad and opposite to the first side; and
    a supporting portion connected with an end portion of each lead on the second side,
    wherein a groove is formed in each lead, such that each lead is dented from a lower surface of each lead over a full width of each lead in a width direction of each lead at another end portion of each lead on the second side so that the groove is opened at the lower surface and a side surface of each lead on the second side, and
    an embedded body made of solder is embedded in the groove of each lead.

11. The lead frame according to claim 10, wherein each lead has a thin stop portion with a stop space under the stop portion in a lower side of each lead at an end portion on the first side.

12. The lead frame according to claim 11, wherein
    the die pad has a body portion in the form of a rectangle in plan view and a stop portion surrounding the periphery of the body portion,
    the stop portion of the die pad is more thinly formed than the body portion and an upper surface of the stop portion of the die pad is flush with an upper surface of the body portion, and
    wherein a stop space is formed below the stop portion of the die pad and beside a side surface of the body portion.

13. A method of manufacturing a semiconductor device with the lead frame according to claim 12, comprising:
    a bonding step of die-bonding the semiconductor chip onto the die pad while upwardly directing a device forming surface and electrically connecting the semiconductor chip and the plurality of leads to each other with a bonding wire;
    a sealing step of sealing the semiconductor chip with sealing resin along with the lead frame so that the sealing resin enters the stop space of the die pad and the stop space of the lead and a lower surface of the body portion of the die pad, and the lower surfaces of the plurality of leads and the embedded body embedded in the groove of each lead are exposed from the sealing resin; and a dicing step of removing the supporting portion and the sealing resin on the supporting portion by cutting with a dicing saw.

* * * * *